United States Patent [19]
Pei

[11] Patent Number: 6,135,784
[45] Date of Patent: Oct. 24, 2000

[54] LIF PGA SOCKET

[75] Inventor: Wen-Chun Pei, Taipei, Taiwan

[73] Assignee: Hon Hai Precision Ind. Co., Ltd., Taipei Hsien, Taiwan

[21] Appl. No.: 09/330,260

[22] Filed: Jun. 10, 1999

[30] Foreign Application Priority Data

Dec. 24, 1998 [TW] Taiwan ................................. 87221549

[51] Int. Cl.$^7$ ................................................ H01R 12/00
[52] U.S. Cl. ................................................ 439/70; 439/856
[58] Field of Search ............................... 439/70, 71, 525, 439/526, 83, 82, 81, 330, 842, 845, 856, 857

[56] References Cited

U.S. PATENT DOCUMENTS

| | | |
|---|---|---|
| 3,602,875 | 8/1971 | Pierini ....................................... 439/525 |
| 3,621,444 | 11/1971 | Stein ........................................... 439/70 |
| 4,934,967 | 6/1990 | Marks et al. ............................. 439/856 |
| 5,046,972 | 9/1991 | Pass ......................................... 439/856 |
| 5,399,108 | 3/1995 | Lu et al. .................................. 439/857 |
| 5,518,426 | 5/1996 | Plainer ....................................... 439/70 |
| 6,024,584 | 2/2000 | Lemke et al. ............................. 439/83 |

*Primary Examiner*—T. C. Patel
*Attorney, Agent, or Firm*—Wei Te Chung

[57] ABSTRACT

An electrical socket includes an insulative cover, a base defining passageways therethrough, and a board, all being secured together. A plurality of electrical terminals is received in the passageways of the base. Each of the terminals has a back portion with a pair of arms provided at opposite sides thereof, a contact section inwardly extending from each arm for abutting against a corresponding pin of a CPU, and a tip extending from the back portion.

17 Claims, 5 Drawing Sheets

LIF PGA SOCKET

FIELD OF THE INVENTION

The present invention generally relates to a socket for a CPU, and particularly to a LIF PGA socket having terminals which can be conveniently soldered to a circuit board, and can properly align and contact with pins of the CPU.

THE PRIOR ART

As is well known, a CPU can be considered to be the brain of a computer and is mounted on a mother board for processing an enormous amount of information. The CPU requires a large number of terminals received in corresponding passageways defined in a socket for connecting the CPU and the mother board. Related conventional LIF PGA sockets are disclosed in Taiwan Patent Application Nos. 81214806 and 81217180.

Referring to FIG. 1, a socket 10 of the prior art comprises an insulative housing 12 and a plurality of electrical terminals 16 secured in passageways thereof. Two contact portions 18 outwardly extend from opposite sides of an end of each terminal for receiving pins 20 of a CPU therein, and a tail 22 is formed at another end thereof extending beyond the housing 12 for being soldered to a mother board 24. However, the contact portions 18 of the terminals 16 extend outwardly whereby misalignment and improper contact may occur when the pins 20 of the CPU are inserted therein. Furthermore, as shown FIG. 1, the opening of each passageway exposed to the mother board 24 is so large that molten solder may enter the passageway and reach the level of the contact portions of the terminals 16 during soldering thereby adversely affecting signal transmission through the socket 10. In addition, due to the large amount of the pins 20 of the CPU, the insertion force required to assemble the CPU to the socket 10 is considerable. Therefore, a socket which can overcome the disadvantages of the prior art is required.

SUMMARY OF THE INVENTION

Accordingly, the primary purpose of the present invention is to provide a socket having reliable and effective contact between terminals thereof and corresponding pins of a CPU.

The second purpose of the invention is to provide a socket which ensures that the terminals thereof are properly soldered to a circuit board.

The third purpose of the invention is to provide a socket that receives a CPU with a low insertion force.

In accordance with one aspect of the present invention, an electrical connector comprises a cover, a base with a plurality of passageways defined therethrough, and a board, all being secured together. A plurality of terminals are received in the passageways and each terminal includes a back portion, two arms positioned at each side thereof, a pair of inwardly bent stop portions defined at one end of the terminal, and a tip downwardly extending from the back portion. The arms form inwardly extending contact portions at ends thereof opposite the stop portions for abutting against the corresponding pin of a CPU. The tip of each terminal is adapted to be inserted into and soldered to the board.

In accordance with another aspect of the present invention, the terminals are retained in the passageways of the base and the contact portions thereof are divided into a number of groups differently distanced from the board. Therefore, the pins of the CPU contact the terminals of the socket at different times thereby reducing the overall insertion force required for assembly.

DETAILED DESCRIPTION OF THE PREFERRED EMBODIMENT

Figure 1:
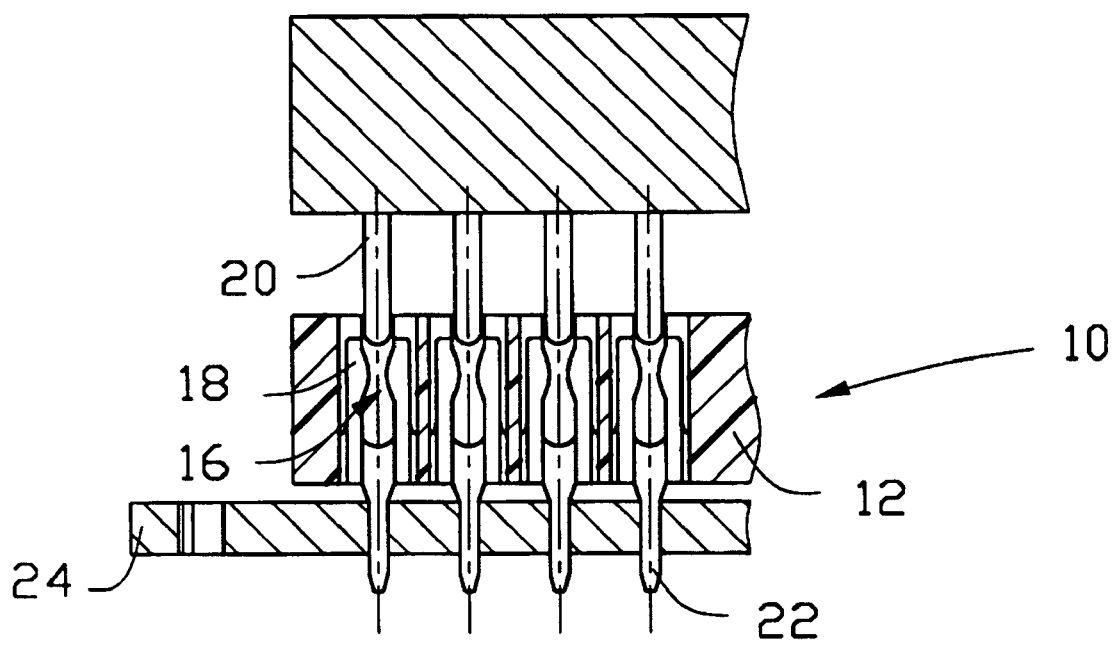
FIG. 1 is a cross-sectional view of a conventional socket, a CPU and a PCB.
Figure 2:
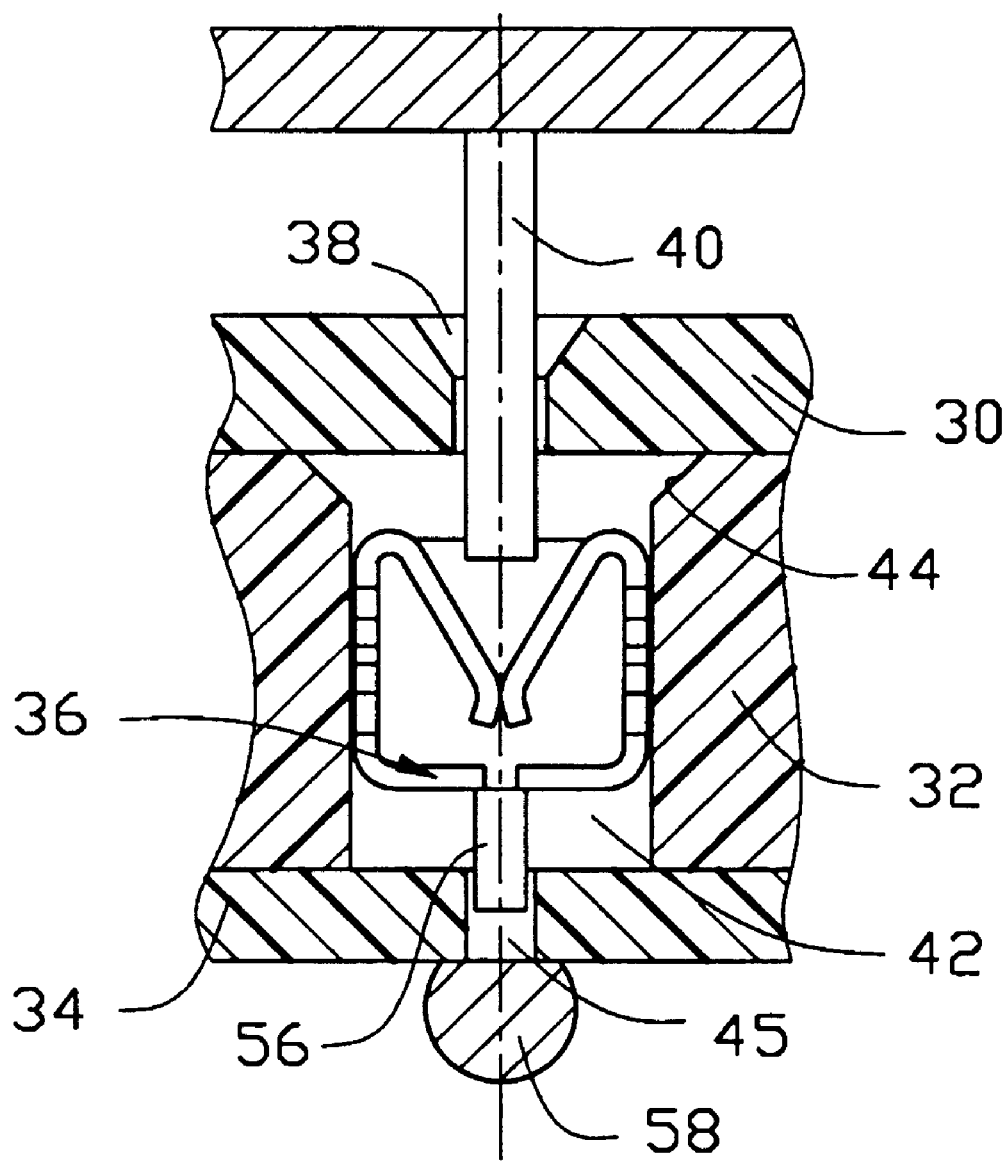
FIG. 2 is a partial cross-sectional view of an assembled socket in accordance with the present invention and a CPU.

With reference to FIG. 2, a LIF PGA socket comprises a base 32 having a top surface and a bottom surface, and a plurality of passageways 42 defined through the top and bottom surfaces for receiving terminals 36 therein, a cover 30 attached to the top surface of the base 32, and a board 34 attached to the bottom surface of the base 32, all being secured together. The cover 30 defines a plurality of leading slots 38 therethrough, and each slot 38 forms a conical leading section and a narrow main section. Each passageway 42 of the base 32 forms a funneled opening 44 exposed to a surface of the base 32 abutting against the cover 30. Correspondingly, the board 34 defines a plurality of apertures 45 therethrough. The slots 38 of the cover 30, the passageways 42 of the base 32, and the apertures 45 of the board 34 are all aligned with each other.

Figure 3:
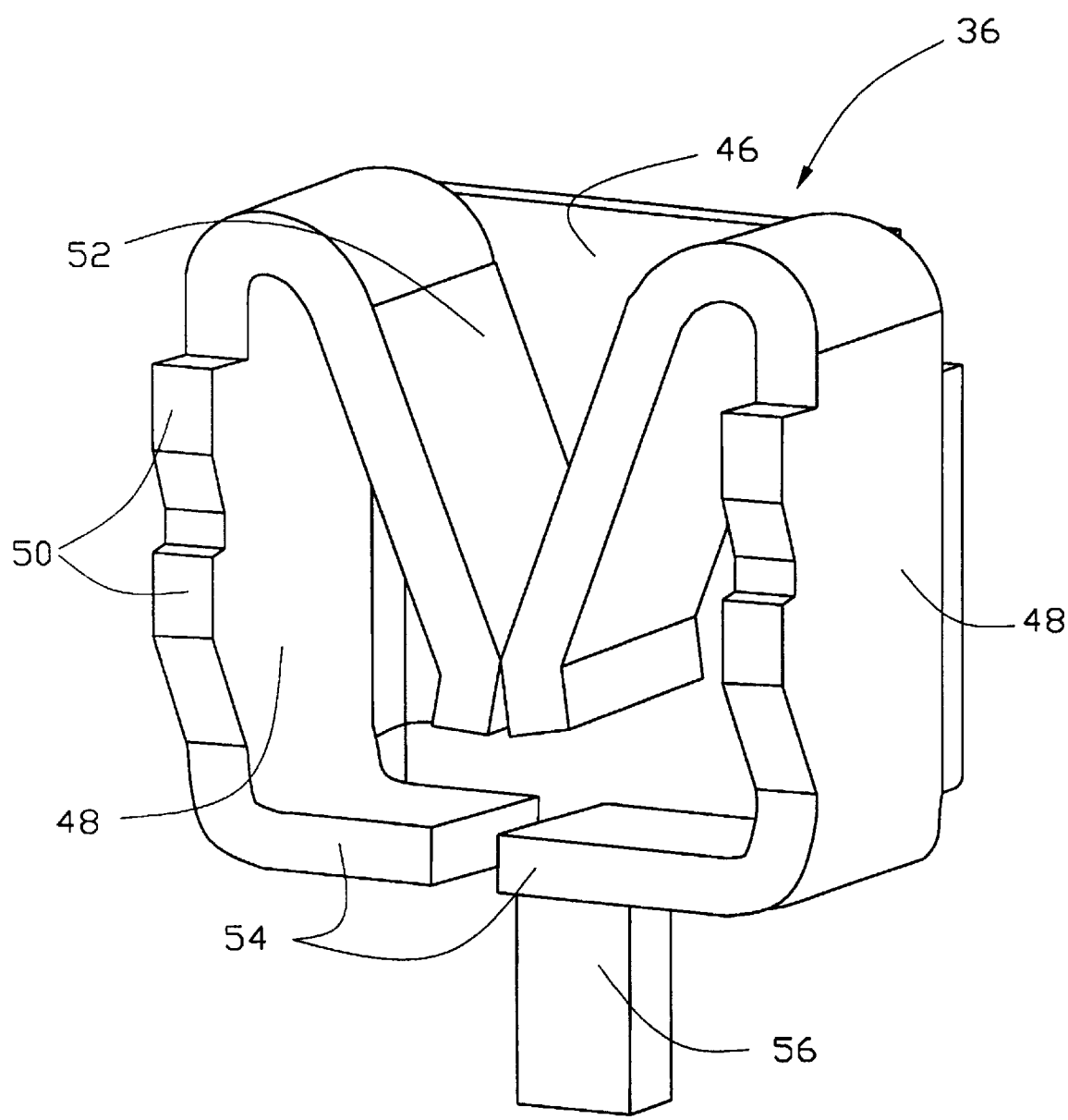
FIG. 3 is an isometric view of a terminal in accordance with the present invention.

Referring also to FIG. 3, each of the terminals 36 is unitarily stamped to have a back portion 46 and two arms 48 perpendicularly extending from opposite side edges of the back portion 46 along an entire height thereof. Each arm has locking barbs 50 projecting from one side thereof for interferentially fitting in the passageways 42 of the base 32. A pair of inwardly bent stop portions 54 horizontally extends from lower ends of the arms 48. A small gap is defined between the ends of the two stop portions 54. A tip 56 extends from the back portion 46 for being soldered to the board 34. Contact portions 52 extending from upper ends of the arms 48 opposite the stop portions 54 project inwardly and downwardly for abutting against pins 40 of a CPU inserted therebetween.

Figure 4:
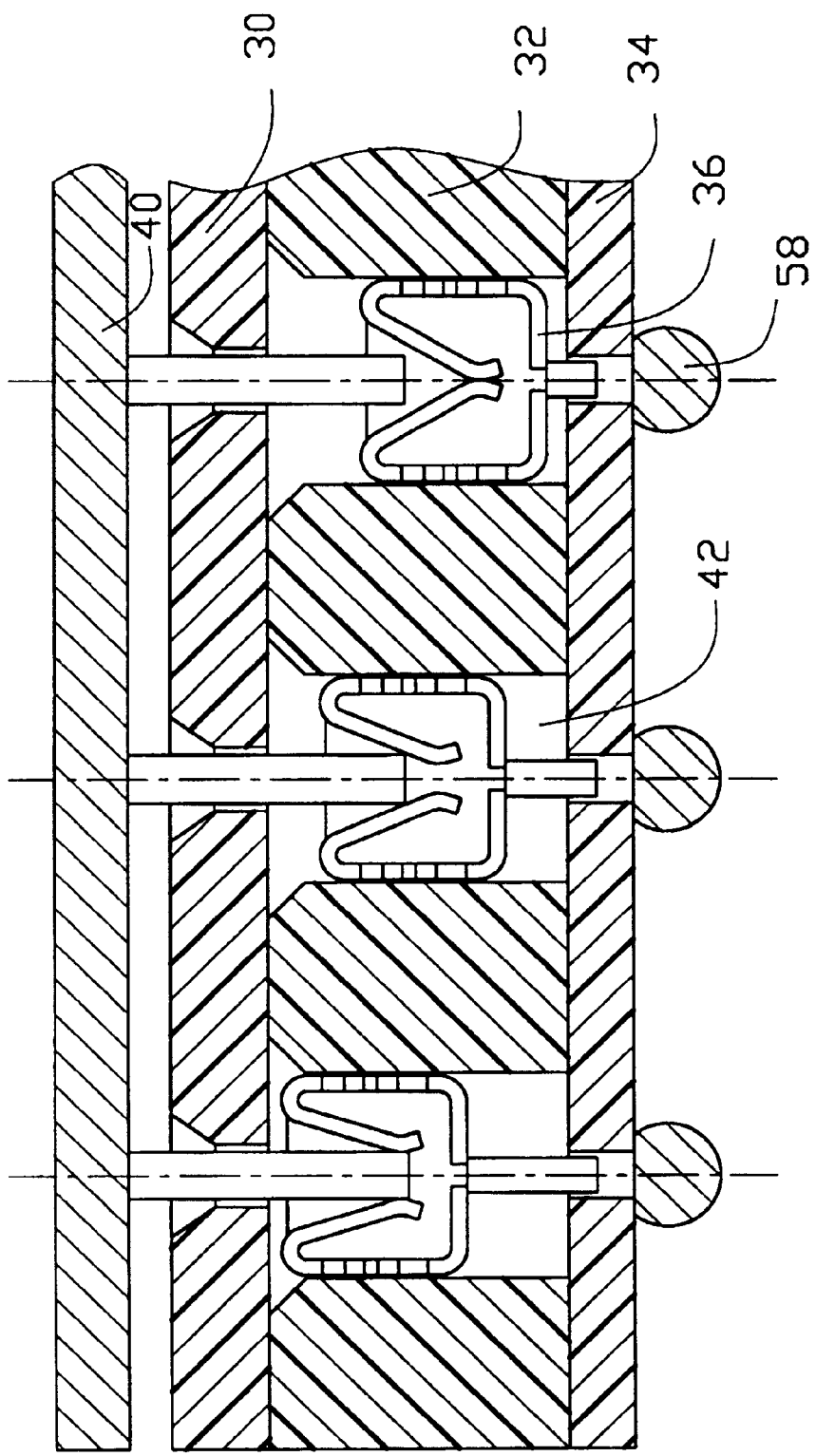
FIG. 4 is another cross-sectional view of the assembled socket of the present invention and a CPU.
Figure 5:
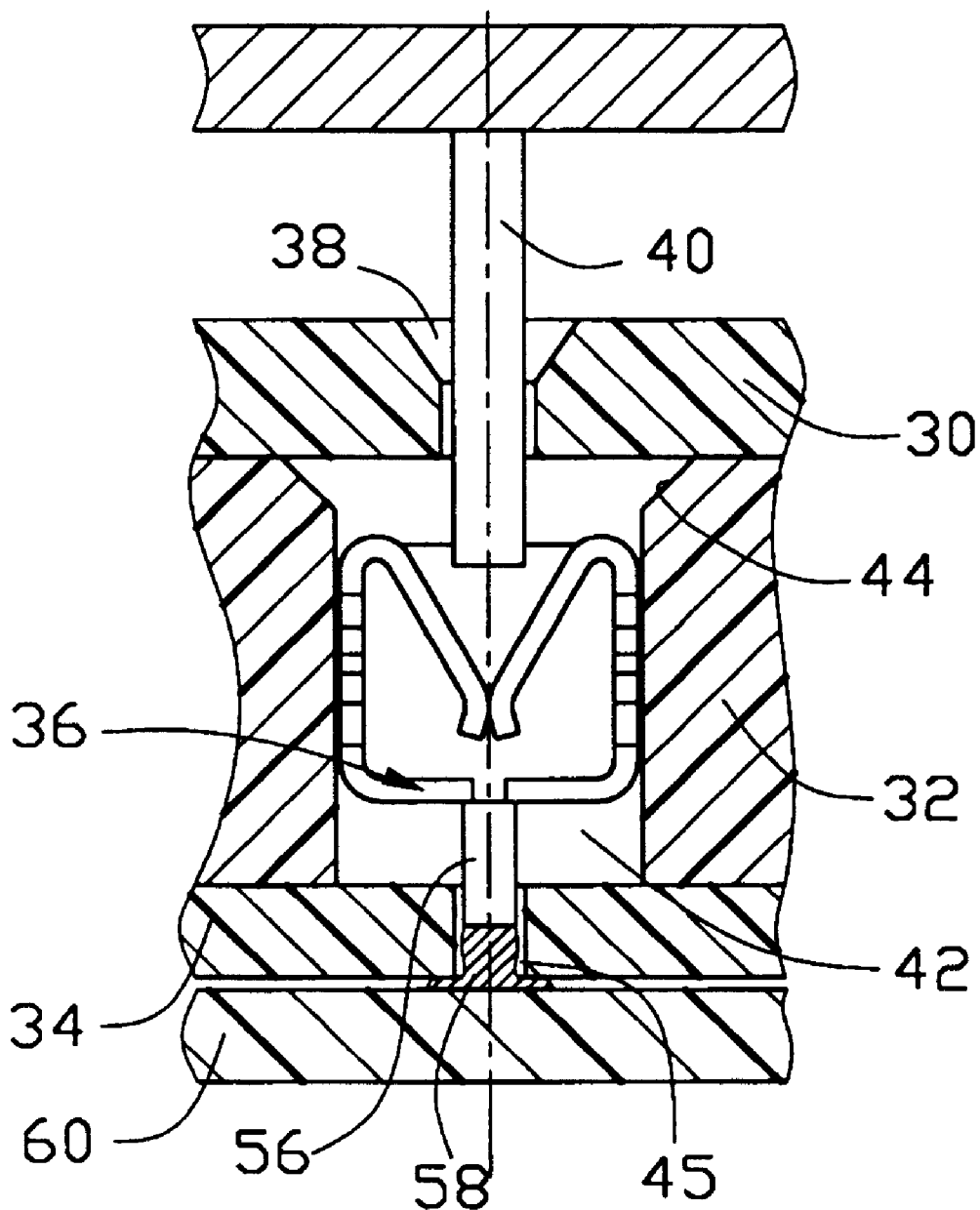
FIG. 5 is a view similar to FIG. 2 showing a solder ball being melted to connect a terminal of the socket to a mother board.

As shown in FIG. 4, the terminals 36 are retained in the passageways 42 of the base 34 and the contact portions 52 thereof are positioned at different horizontal planes. Therefore, the pins 40 of the CPU contact the terminals 36 of the socket at different times thereby reducing the insertion force required to assemble the CPU to the socket. Due to the above-mentioned configuration of the contact portions 52 of the terminals 36, misalignment and improper contact are unlikely to occur when the pins 40 of the CPU are engaged with the terminals 36.

Referring to FIG. 2, the terminals 36 are soldered to the board 34 by a conventional method; thus, a description thereof is omitted herein. Solder balls 58 formed at each opening of the apertures 45 of the board 34 are melted by an infrared soldering procedure to bond the tips 56 of the terminals 36 to a mother board 60. During soldering, the molten solder 58 is prevented from rising upward and reaching the contact portions 52 of the terminals 36 due to the provision of the stop portions 54; thus, signal transmission through the socket will not be adversely affected. The board 34 is then soldered to the mother board 60. Since the board 34 is made from a material with substantially the same CTE (Coefficient of Thermal Expansion) as that of the mother board 60, the relative position of the two boards and the solder disposed thereon is not likely to change much during the soldering process and proper soldering procedures can be ensured.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. An electrical socket for receiving pins of a CPU, comprising:
   a base having a top surface and a bottom surface, and a plurality of passageways defined through the top and bottom surfaces;
   a cover attached to the top surface of the base and defining a plurality of apertures therethrough aligned with the passageways of the base;
   a board attached to the bottom surface of the base and defining a plurality of slots therethrough aligned with the passageways of the base; and
   a plurality of electrical terminals retained in the passageways of the base, each electrical terminal including a back portion, two arms extending forwardly from opposite sides thereof, the back portion substantially extending along an entire height of the arms, each arm having a contact portion projecting inwardly and downwardly for receiving CPU pins therebetween, and a tip projecting from the back portion and extending into the corresponding aperture of the board.

2. The electrical socket as claimed in claim 1, wherein said board of the socket is made from a material with substantially the same (coefficient of thermal expansion) as that of a mother board.

3. The electrical socket as claimed in claim 1, wherein the contact portions are divided into a number of groups differently distanced from the board.

4. The electrical socket as claimed in claim 1, wherein each slot of the cover has a leading section.

5. The electrical socket as claimed in claim 1, wherein each passageway of the base forms a funneled opening at a surface thereof which abuts against the cover.

6. The electrical socket as claimed in claim 1, wherein each arm has a locking barb projecting from one side thereof.

7. The electrical socket as claimed in claim 1, wherein each terminal forms a pair of inwardly bent stop portions at a lower end of each arm thereof.

8. An electrical terminal for a socket, comprising:
   a back portion; the back portion substantially extending along an entire height of the arms
   a pair of arms each extending from one of two opposite sides of the back portion;
   a contact portion defined by an upper end of each arm, said arm extending inwardly and downwardly to form the contact portion;
   an inwardly bent stop portion formed at a lower end of each arm; and
   a tip extending from the back portion.

9. The electrical socket as claimed in claim 8, wherein the arms vertically extend from the opposite edges of the back portion along an entire height thereof.

10. The electrical socket as claimed in claim 8, wherein said stop portions horizontally extend from the lower ends of the arms.

11. An electrical socket comprising:
    a printed circuit board
    a base having a top surface, bottom surface, and a plurality of passageways defined between said top and said bottom surfaces;
    a board attached to the bottom surface of the base, and defining therethrough a plurality of apertures aligned with the corresponding passageways, respectively, said board being made from material same as that of said printed circuit board on which the socket is seated;
    a plurality of terminals respectively retained within the corresponding passageways of the base, each of said terminals including a tip extending into the corresponding aperture of the board; and
    a plurality of solder balls attached to bottom portions of the corresponding apertures, respectively, for soldering to the printed circuit board.

12. A contact terminal for a ZIF socket, comprising:
    a back portion having a rectangular plate-like configuration;
    a pair of arms projecting perpendicularly and forwardly from a face of the back portion; the back portion substantially extending along an entire height of the arms
    a contact portion defined by an upper end of each arm, said arms extending toward each other and having a free end thereof for engaging with a CPU pin;
    a stop portion inwardly extending from a lower end of each arm for preventing solder from wicking to contaminate the contact portions and perpendicularly, said stop portions having free end edges facing each other; and
    a tip extending downwardly from the back portion for electrically connecting the contact terminal to a printed circuit board.

13. The contact terminal in accordance with claim 12, wherein each arm has barbs formed thereon for fixedly engaging with a housing of the socket connector.

14. The contact terminal in accordance with claim 13, wherein the barbs are formed at a front edge of a corresponding arm distant from the back portion.

15. The contact terminal in accordance with claim 12, wherein the arms are located at opposite said edges of the back portion.

16. The contact terminal in accordance with claim 12, wherein the arms extend an entire height of the back portion.

17. An electrical socket assembly comprising:
    a printed circuit board; and
    an electrical socket seated on the printed circuit board, said socket, comprising:
    a base having a top surface, a bottom surface, and a plurality of passageways defined between said top and said bottom surfaces;
    a board attached to the bottom surface of the base, and defining therethrough a plurality of apertures aligned with the corresponding passageways, respectively, said board being made from material the same as that of the printed circuit board;
    a plurality of terminals respectively retained within the corresponding passageways of the base, each of said terminals including a tip extending into the corresponding aperture of the board; and
    a plurality of solder balls attached to bottom portions of the corresponding apertures, respectively, said solder balls being melted to electrically connect the printed circuit board to the tips of the terminals.

* * * * *